United States Patent
Cheng et al.

(10) Patent No.: US 10,470,323 B2
(45) Date of Patent: Nov. 5, 2019

(54) HINGE STRUCTURE AND ELECTRONIC DEVICE USING THE SAME

(71) Applicants: Hsien-Hung Cheng, Taipei (TW); You-Yu Chen, Taipei (TW); Chia-Wei Chou, Taipei (TW); Po-Yi Chang, Taipei (TW); Cheng-Yo Hsiao, Taipei (TW); Wei-Ting Liu, Taipei (TW)

(72) Inventors: Hsien-Hung Cheng, Taipei (TW); You-Yu Chen, Taipei (TW); Chia-Wei Chou, Taipei (TW); Po-Yi Chang, Taipei (TW); Cheng-Yo Hsiao, Taipei (TW); Wei-Ting Liu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 7 days.

(21) Appl. No.: 16/035,712

(22) Filed: Jul. 16, 2018

(65) Prior Publication Data

US 2019/0021179 A1 Jan. 17, 2019

Related U.S. Application Data

(60) Provisional application No. 62/533,122, filed on Jul. 16, 2017.

(51) Int. Cl.
| | |
|---|---|
| *H05K 5/02* | (2006.01) |
| *F16C 11/04* | (2006.01) |
| *E05D 11/10* | (2006.01) |
| *G06F 1/16* | (2006.01) |
| *E05D 3/18* | (2006.01) |

(52) U.S. Cl.
CPC ............ *H05K 5/0226* (2013.01); *E05D 3/18* (2013.01); *E05D 11/1028* (2013.01); *F16C 11/04* (2013.01); *G06F 1/1681* (2013.01); *E05Y 2201/484* (2013.01); *E05Y 2900/606* (2013.01)

(58) Field of Classification Search
None
See application file for complete search history.

(56) References Cited

U.S. PATENT DOCUMENTS

| | | | | |
|---|---|---|---|---|
| 7,936,559 B2 * | 5/2011 | Chen | ................ | G06F 1/1662 16/303 |
| 8,520,382 B2 * | 8/2013 | Tye | ................ | G06F 1/203 248/685 |
| 9,207,712 B1 * | 12/2015 | McAlpine | ................ | G06F 1/162 |
| 9,354,669 B2 * | 5/2016 | Chen | ................ | G06F 1/1681 |
| 9,582,048 B2 * | 2/2017 | Ho | ................ | G06F 1/1616 |

(Continued)

*Primary Examiner* — Xanthia C Cunningham
(74) *Attorney, Agent, or Firm* — JCIPRNET

(57) ABSTRACT

A hinge structure includes a first base, a second base, a first linking rod, a second linking rod, and a torque assembly. The first linking rod has a first pivot part, a first sliding part, and a second pivot part. The first pivot part is pivoted to the first base, and the first sliding part is slidably connected to the second base. The second linking rod has a second sliding part, a shaft part, a third pivot part, and a fourth pivot part. The second sliding part is slidably connected to the first base. The third pivot part is pivoted to the second base. The second pivot part is pivoted to the fourth pivot part. The torque assembly has a sleeve part sleeved on the shaft part and a connection part connected to the second base. The sleeve part generates torque during rotation with respect to the shaft part.

16 Claims, 5 Drawing Sheets

(56) References Cited

U.S. PATENT DOCUMENTS

| | | | | |
|---|---|---|---|---|
| 2005/0015927 A1* | 1/2005 | Kropf | ............... | E05D 3/142 |
| | | | | 16/286 |
| 2007/0138369 A1* | 6/2007 | Chang | ............... | A47G 1/143 |
| | | | | 248/688 |
| 2010/0127137 A1* | 5/2010 | Wang | ............... | G06F 1/1616 |
| | | | | 248/188.6 |
| 2011/0157780 A1* | 6/2011 | Wang | ............... | G06F 1/1681 |
| | | | | 361/679.01 |
| 2013/0308268 A1* | 11/2013 | Tani | ............... | G06F 1/1681 |
| | | | | 361/679.57 |
| 2015/0227168 A1* | 8/2015 | Nakamura | ............ | G06F 1/1616 |
| | | | | 361/679.55 |

* cited by examiner

HINGE STRUCTURE AND ELECTRONIC DEVICE USING THE SAME

CROSS-REFERENCE TO RELATED APPLICATION

This application claims the priority benefit of U.S. provisional application Ser. No. 62/533,122, filed on Jul. 16, 2017. The entirety of the above-mentioned patent application is hereby incorporated by reference herein and made a part of this specification.

BACKGROUND OF THE INVENTION

Field of the Invention

The invention relates to a hinge structure and an electronic device, and particularly relates to a hinge structure and an electronic device using the same.

Description of Related Art

In a common electronic device, such as a laptop computer, two bodies of the electronic device are pivoted to each other through a hinge structure, so as to be rotated with respect to each other. In general, a plurality of elastic pieces are usually sleeved on a shaft of a hinge structure. In a process in which the two bodies are rotated with respect to each other, these elastic pieces may generate axial thrust, and torque is also generated due to friction. In this way, an expanded angle between the two bodies after the two bodies are rotated with respect to each other is limited. In addition, the hinge structure may also serve to pivotally connect a set of a tablet computer and a frame, a set of a display and a frame, or a set of two displays.

However, in order to reinforce the reliability of the hinge structure to prevent the two bodies from being rotated with respect to each other when the user does not exert a force due to excessively small torque, for example, the common practice is to increase the size or the number of these elastic pieces in the hinge structure. However, such practice may cause conflicts in developing the electronic device to be thinner and lighter.

SUMMARY OF THE INVENTION

The invention provides a hinge structure and an electronic device using the same which meet the design requirement of being thinner and lighter.

A hinge structure according to an embodiment of the invention includes a first base, a second base, at least one first linking rod, a second linking rod, and a torque assembly. The second base is disposed opposite to the first base. The first linking rod has a first pivot part, a first sliding part opposite to the first pivot part, and a second pivot part located between the first pivot part and the first sliding part. The first pivot part is pivoted to the first base, and the first sliding part is slidably connected to the second base. The second linking rod is disposed at a side of the first linking rod and has a second sliding part, a shaft part opposite to the second sliding part, a third pivot part located between the second sliding part and the shaft part, and a fourth pivot part located between the second sliding part and the third pivot part. The second sliding part is slidably connected to the first base, the third pivot part is pivoted to the second base, and the second pivot part is pivoted to the fourth pivot part. The torque assembly has a sleeve part and a connection part opposite to each other. The sleeve part is sleeved on the shaft part and configured to generate torque during rotation with respect to the shaft part, and the connection part is connected to the second base.

An electronic device according to an embodiment of the invention includes a first body, a second body, and the hinge structure. The first body is rotatably connected to the second body through the hinge structure, the first base is fixed to the first body, and the second base is fixed to the second body.

According to an embodiment of the invention, the torque assembly includes a sliding rod and a guiding rod. The sliding rod includes a sleeve part and a sliding part, and the guiding rod includes a connection part and the guiding part. The sliding part is slidably inserted into the guiding part, and the connection part is rotatably connected to the second base.

According to an embodiment of the invention, an inner circumferential surface of the sleeve part contacts an outer circumferential surface of the shaft part, the outer circumferential surface of the shaft part has a first section and a second section connected with each other, and an outer diameter of the first section is smaller than an outer diameter of the second section.

According to an embodiment of the invention, a recess is provided on an inner circumferential surface of the sleeve part, and the hinge structure further includes a torque reinforcing member disposed in the recess and abutting against an outer circumferential surface of the shaft part.

According to an embodiment of the invention, the first base has a first accommodating groove and at least one second accommodating groove arranged side by side, and the second base has a third accommodating groove and at least one fourth accommodating groove arranged side by side. The first accommodating groove is aligned to the third accommodating groove and configured to accommodate the second linking rod and the torque assembly. The second accommodating groove is aligned to the fourth accommodating groove and configured to accommodate the first linking rod.

According to an embodiment of the invention, the hinge structure further includes an elastic member. The elastic member has a first end and a second end opposite to each other, and the first end and the second end respectively abut against the first base and the second base.

According to an embodiment of the invention, the elastic member is a torsion spring, and the second base has a positioning part. The torsion spring is sleeved on the positioning part.

According to an embodiment of the invention, the second base further has a blocking part located at a side of the positioning part and serving to block the first end of the elastic member when the first end is separated from the first base.

Based on the above, in the hinge structure adopted in the electronic device of the invention, one of the first and second linking rods is fit with the torque assembly. Therefore, when the first body and the second body are rotated with respect to each other, the torque assembly may exert torque to the one of the first and second linking rods. The torque assembly is more flexible design-wise, and helps reduce the thickness of the hinge structure. Therefore, the design requirement of being thinner and lighter can be better met.

In order to make the aforementioned and other features and advantages of the invention comprehensible, several exemplary embodiments accompanied with figures are described in detail below.

DESCRIPTION OF THE EMBODIMENTS

Figure 1:
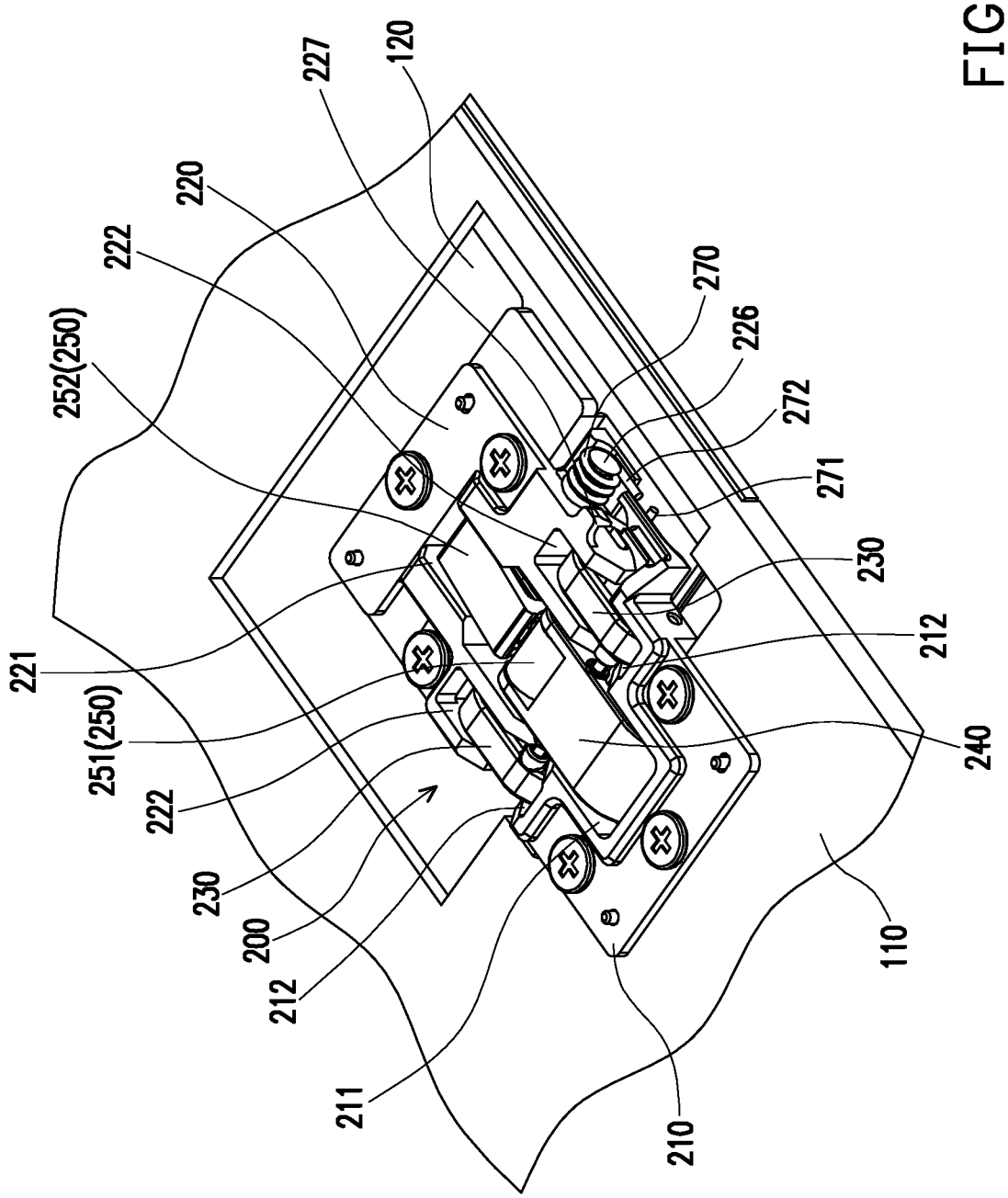
FIG. 1 is a schematic partial view illustrating that an electronic device according to an embodiment of the invention is in a first state.
Figure 2:
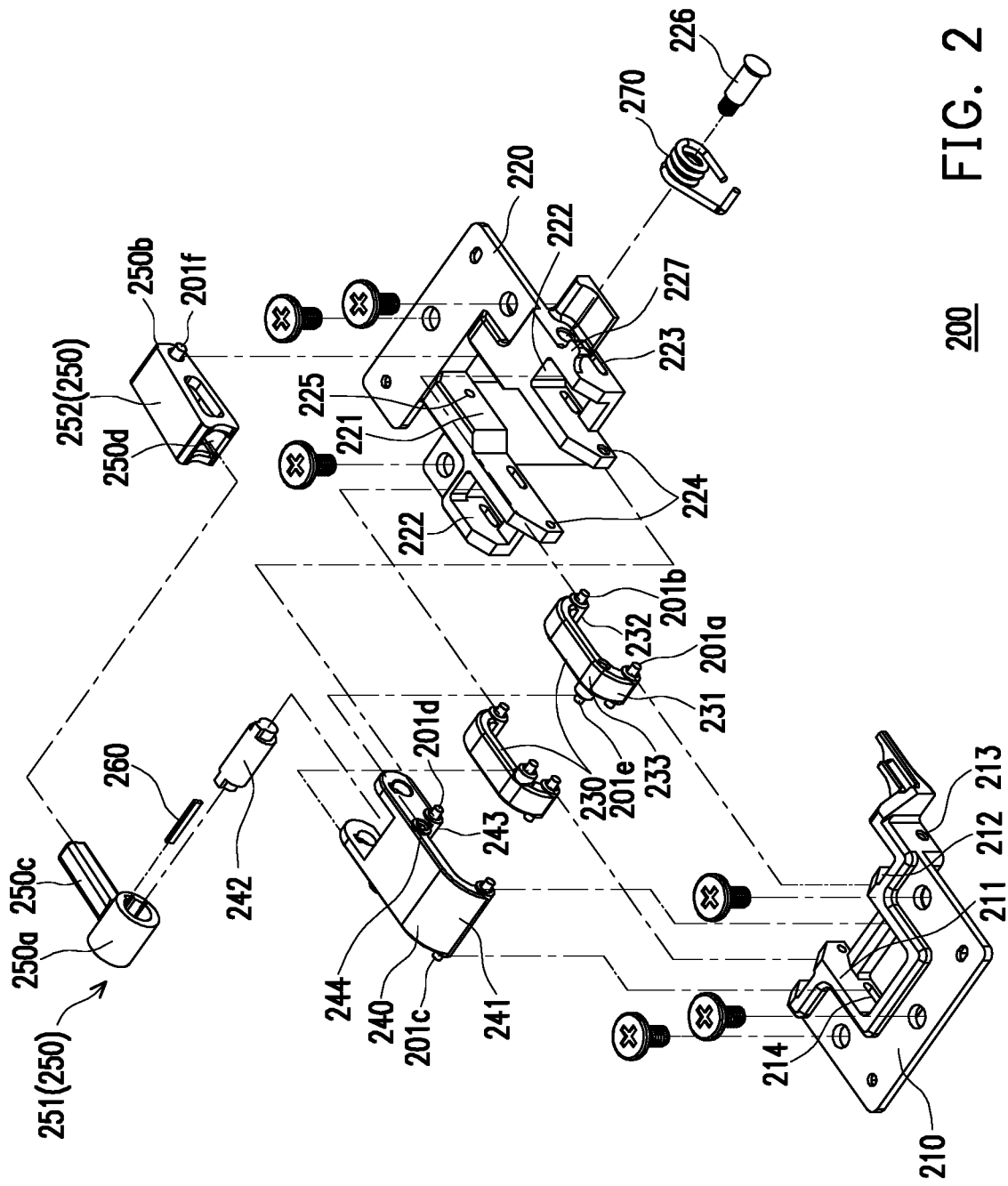
FIG. 2 is a schematic exploded view illustrating a hinge structure of FIG. 1.
Figure 3:
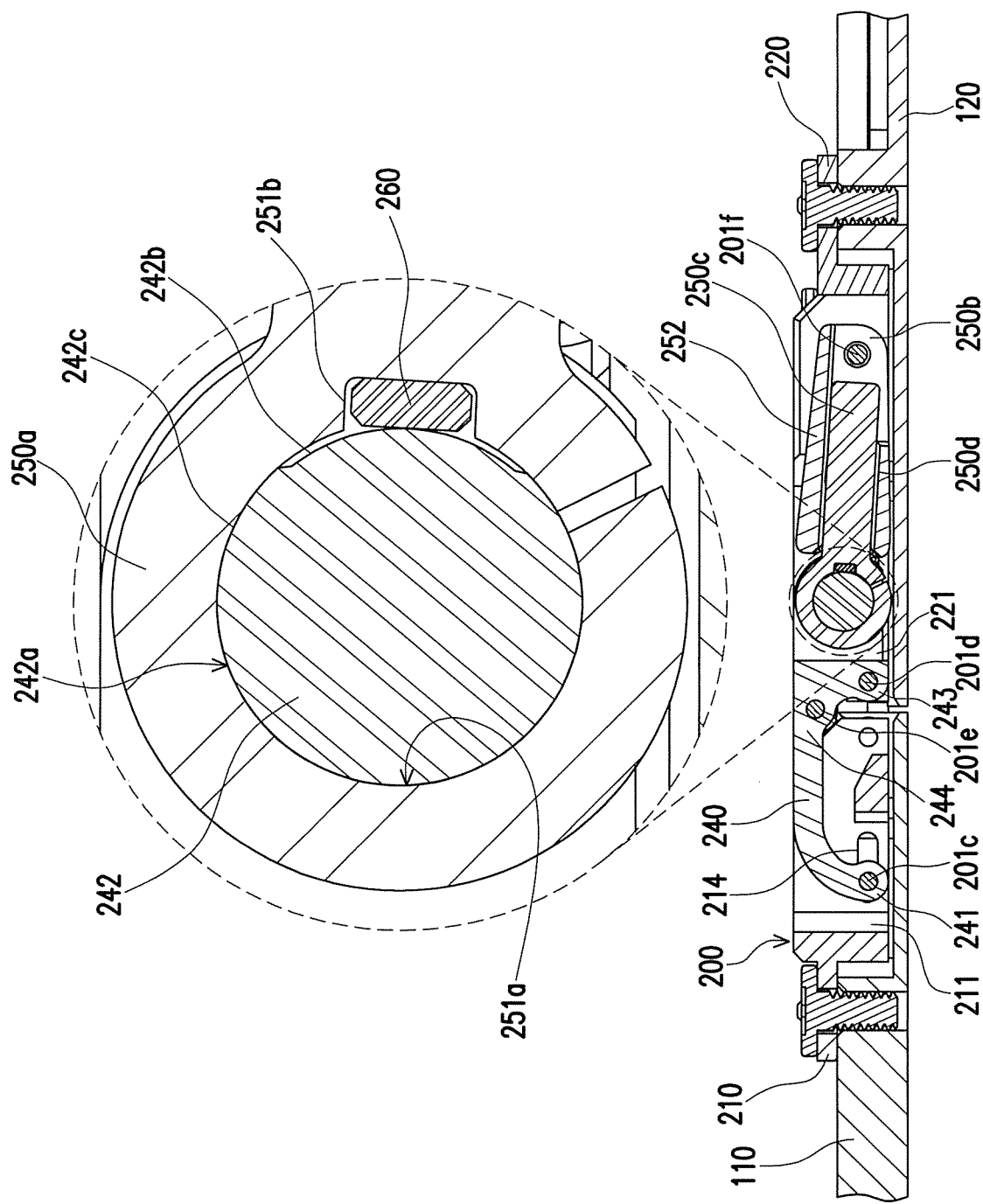
FIG. 3 is a schematic partial cross-sectional view at a location of the hinge structure in the electronic device of FIG. 1.

FIG. 1 is a schematic partial view illustrating that an electronic device according to an embodiment of the invention is in a first state. FIG. 2 is a schematic exploded view illustrating a hinge structure of FIG. 1. FIG. 3 is a schematic partial cross-sectional view at a location of the hinge structure in the electronic device of FIG. 1. Referring to FIGS. 1 to 3, in the embodiment, an electronic device 100 may be a laptop computer, a set of a tablet computer and a frame, a set of a display and a frame, or a set of two displays. The invention does not intend to impose a limitation on the types of the electronic device 100. The electronic device 100 includes a first body 110, a second body 120, and a hinge structure 200. The first body 110 is rotatably connected to the second body 120 through the hinge structure 200. In addition, since the hinge structure 200 generates torque, an included angle between the first body 110 and the second body 120 can be limited by the hinge structure 200. For example, the first body 110 and the second body 120 shown in FIG. 1 is in the first state (i.e., closed state), and the included angle therebetween may be construed as 0 degrees. When the user does not exert a force to rotate the first body 110 and the second body 120 with respect to each other, the torque generated by the hinge structure 200 limits the first body 110 and the second body 120 to the first state (i.e., closed state) and thereby prevent the first body 110 and the second body 120 from being rotated with respect to each other unlimitedly.

The hinge structure 200 includes a first base 210, a second base 220, at least one first linking rod 230, a second linking rod 240, and a torque assembly 250. The first base 210 is fixed to the first body 110, and the second base 220 disposed opposite to the first base 210 is fixed to the second body 120. In the embodiment, the number of the first linking rods 230 is two. The first linking rods 230 are symmetrically disposed at two opposite sides of the second linking rod 240. With such a configuration, the movement of the hinge structure 200 becomes more stable. However, the number of the first linking rods 230 is not limited to two. It is also plausible to use the second linking rod 240 and one single first linking rod 230.

Besides, the first base 210 has a first accommodating groove 211 and at least one second accommodating groove 212 arranged side by side. The number of the second accommodating grooves 212 corresponds to the number of the first linking rods 230. For example, if there are two first linking rods 230, then two second accommodating grooves 212 are disposed symmetrically at two opposite sides of the first accommodating groove 211. Correspondingly, the second base 220 has a third accommodating groove 221 and at least one fourth accommodating groove 222 arranged side by side. The first accommodating groove 211 is aligned to the third accommodating groove 221 to accommodate the second linking rod 240. The number of the fourth accommodating grooves 222 corresponds to the number of the first linking rods 230. For example, if there are two first linking rods 230, then two fourth accommodating grooves 222 are disposed symmetrically at two opposite sides of the third accommodating groove 221. Each of the second accommodating grooves 212 is aligned to one of the fourth accommodating grooves 222 and configured to accommodate one of the first linking rods 230. With the above design of the accommodating grooves, the thickness of the hinge structure 200 can be reduced, so as to meet the design requirement of being thinner and lighter.

In the embodiment, each of the first linking rods 230 has a first pivot part 231, a first sliding part 232 opposite to the first pivot part 231, and a second pivot part 233 located between the first pivot part 231 and the first sliding part 232. In addition, a pivot hole 213 is disposed at the location of each of the second accommodating grooves 212 in the first base 210, and a sliding groove 223 is disposed at the location of each of the fourth accommodating grooves 222 in the second base 220. The first pivot part 231 of each of the first linking rods 230 is pivoted to the corresponding pivot hole 213 through a shaft rod 201a, and the first sliding part 232 may be slidably connected to the corresponding sliding groove 223 through a shaft rod 201b. Besides, the second linking rod 240 has a second sliding part 241, a shaft part 242 opposite to the second sliding part 241, a third pivot part 243 located between the second sliding part 241 and the shaft part 242, and a fourth pivot part 244 located between the second sliding part 241 and the third pivot part 243. In addition, a sliding groove 214 is disposed at the location of the first accommodating groove 211 in the first base 210, and a pivot hole 224 is disposed at the location of the third accommodating groove 221 in the second base 220. The second sliding part 241 of the second linking rod 240 may be slidably connected to the sliding groove 214 through a shaft rod 201c, and the third pivot part 243 may be pivoted to the pivot hole 224 through a shaft rod 201d.

According to the above, the second pivot part 233 of each of the first linking rods 230 is pivoted to the fourth pivot part 244 of the second linking rod 240. More specifically, each of the first linking rods 230 has a degree of freedom of motion of rotating with respect to the first base 210 and a degree of freedom of motion of sliding with respect to the second base 220, and the second linking rod 240 has a degree of freedom of motion of rotating with respect to the second base 220 and a degree of freedom of motion of sliding with respect to the first base 210. In addition, the second linking rod 240 and each of the first linking rods 230 are rotated with respect to each other. Based on the design, the first body 110 and the second body 120 can be stably rotated with respect to each other through the hinge structure 200.

Referring to FIGS. 1 to 3 again, in the embodiment, the first accommodating groove 211 and the third accommodating groove 221 are aligned to each other to be configured to accommodate the second linking rod 240 and the torque assembly 250. More specifically, the torque assembly has a sleeve part 250a and a connection part 250b opposite to each other. The sleeve part 250a is sleeved on the shaft part 242 of the second linking rod 240 and configured to generate torque during rotation with respect to the shaft part 242, and the connection part 250b is connected to the second base 220. More specifically, the torque assembly 250 includes a sliding rod 251 and a guiding rod 252. The sliding rod 251 includes the sleeve part 250a and the sliding part 250c, and the guiding rod 252 includes the connection part 250b and a guiding part 250d. Here, the guiding part 250d may be a sliding groove, and the sliding part 250c is slidably inserted into the guiding part 250d.

Besides, a pivot hole 225 is disposed at the location of the third accommodating groove 221 in the second base 220, and the connection part 250b is rotatably connected to the pivot hole 225 through a shaft rod 201f. In other words, the torque assembly 250 has a degree of freedom of motion of rotating with respect to the second linking rod 240 and a degree of freedom of motion of rotating with respect to the second base 220, and the sliding rod 251 may slide with respect to the guiding rod 252. Therefore, the torque assembly 250 not only exerts torque to the shaft part 242 of the second linking rod 240 during relative movement of the second linking rod 240 with respect to each of the first linking rods 230 but does not obstruct the relative movement of the second linking rod 240 with respect to each of the first linking rods 230. Therefore, the relative movement of the second linking rod 240 with respect to each of the first linking rods 230 becomes more stable.

The following will focus on the design of the torque assembly 250. In the embodiment, an inner circumferential surface 251a of the sleeve part 250a contacts an outer circumferential surface 242a of the shaft part 242 of the second linking rod 240. In addition, the outer circumferential surface 242a has a first section 242b and a second section 242c connected with each other, and an outer diameter of the first section 242b is smaller than an outer diameter of the second section 242c. As shown in FIG. 3, the inner circumferential surface 251a of the sleeve part 250a contacts the second section 242c of the outer circumferential surface 242a, but keeps a distance from the first section 242b.

More specifically, a recess 251b is disposed on the inner circumferential surface 251a of the sleeve part 250a, and the hinge structure 200 further includes a torque reinforcing member 260 disposed in the recess 251b. The electronic device 100 is in the first state (i.e., the closed state), a portion of the inner circumferential surface 251a of the sleeve part 250a abuts against the first section 242b of the outer circumferential surface 242a through the torque reinforcing member 260. For example, the torque reinforcing member 260 has the flexibility of elastic deformation to cope with the variation of the profile of the outer circumferential surface 242a and be suitably deformed. Also, the torque reinforcing member 260 constantly abuts against the outer circumferential surface 242a of the shaft part 242. With the inner circumferential surface 251a of the sleeve part 250a contacting the outer circumferential surface 242a of the shaft part 242 and the torque reinforcing member 260 contacting the outer circumferential surface 242a of the shaft part 242, the sleeve part 250a and the shaft part 242 may generate torque due to friction during relative rotation, so as to limit the degree of freedom of motion of the second linking rod 240 with respect to each of the first linking rods 230, the degree of freedom of motion of the second linking rod 240 with respect to the first base 210 and the second base 220, and the degree of freedom of motion of each of the first linking rods 230 with respect to the first base 210 and the second base 220. Since the torque assembly 250 is more flexible design-wise, and helps reduce the thickness of the hinge structure 200, the design requirement of being thinner and lighter can be better met.

In some embodiments, the design with an oil-pressure damper, a hydraulic damper, or an air-pressure damper may be adopted for coordinated operation between the sliding part 250c of the sliding rod 251 and the guiding part 250d of the guiding rod 252, and torque may be correspondingly generated upon acting of a damping force on the shaft part 242 of the second linking rod 240.

Figure 4:
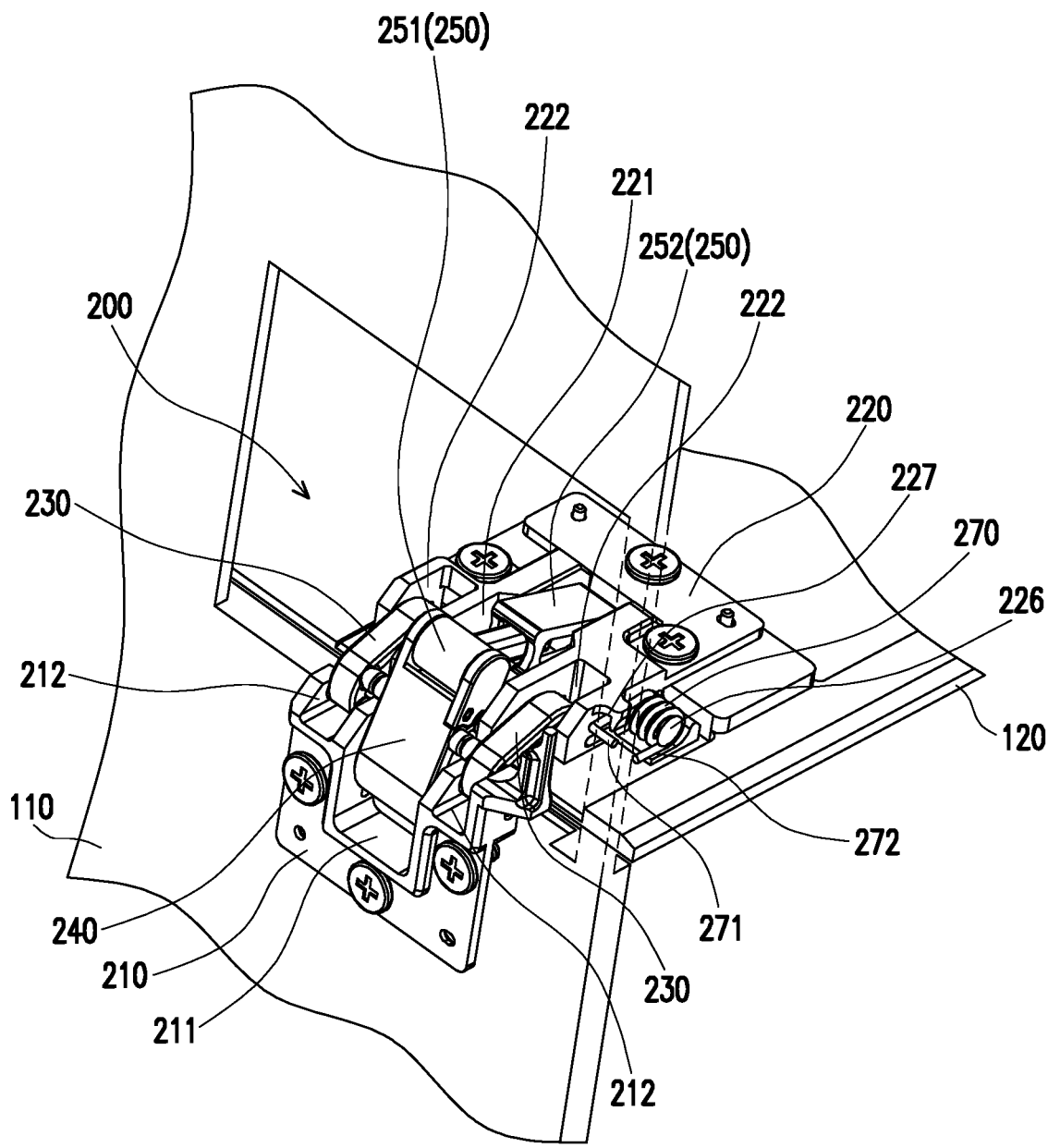
FIG. 4 is a schematic view illustrating the electronic device of FIG. 1 after the electronic device is converted into a second state.
Figure 5:
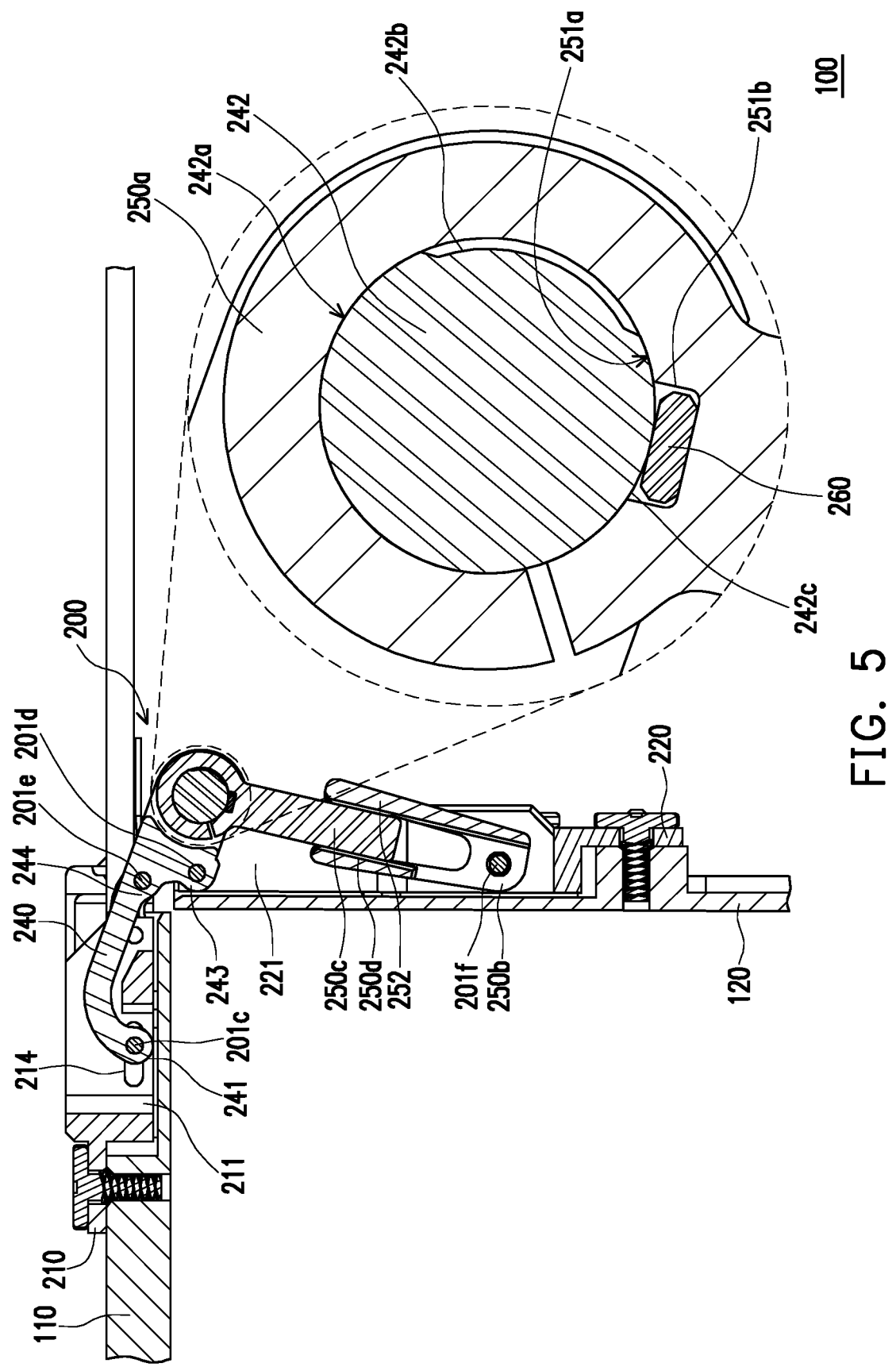
FIG. 5 is a schematic partial cross-sectional view at a location of the hinge structure in the electronic device of FIG. 4.

FIG. 4 is a schematic view illustrating the electronic device of FIG. 1 after the electronic device is converted into a second state. FIG. 5 is a schematic partial cross-sectional view at a location of the hinge structure in the electronic device of FIG. 4. To clearly illustrate the configuration of the hinge structure 200, a portion of the first body 110 is shown with broken lines. Referring to FIGS. 4 and 5, the electronic device 100 is in the second state (i.e., the expanded state), the expanded angle between the first body 110 and the second body 120 of the electronic device 100 is 90°, for example. However, the invention does not intend to limit the expanded angle. As shown in FIG. 5, a portion of the sleeve part 250a abuts against the second section 242c of the outer circumferential surface 242a through the torque reinforcing member 260. In other words, the torque reinforcing member 260 is moved from the first section 242b of the outer circumferential surface 242a to the second section 242c. Since the outer diameter of the second section 242c is greater than the outer diameter of the first section 242b, the elastic deformation of the torque reinforcing member 260 is increased. In addition, the torque correspondingly generated upon acting of the elastic restoring force of the torque reinforcing member 260 on the shaft part 242 is correspondingly increased. Besides, in correspondence with the relative movement between the second linking rod 240 and each of the first linking rods 230, the sliding part 250c of the sliding rod 251 may slide a distance with respect to the guiding part 250d of the guiding rod 252. The distance is determined in accordance with the expanded angle between the first body 110 and the second body 120.

With the inner circumferential surface 251a of the sleeve part 250a contacting the outer circumferential surface 242a of the shaft part 242 and the torque reinforcing member 260 contacting the outer circumferential surface 242a of the shaft part 242, the sleeve part 250a and the shaft part 242 may generate torque due to friction during relative rotation, so as to limit the degree of freedom of motion of the second linking rod 240 with respect to each of the first linking rods 230, the degree of freedom of motion of the second linking rod 240 with respect to the first base 210 and the second base 220, and the degree of freedom of motion of each of the first linking rods 230 with respect to the first base 210 and the second base 220. In this way, the electronic device 100 can be limited to the second state (i.e., the expanded state). When the user exerts a force to the first body 110 and the second body 120, the first body 110 and the second body 120 are rotated with respect to each other, so as to change (e.g., increase or decrease) the expanded angle between the first body 110 and the second body 120.

Referring to FIGS. 1, 2, and 4, in the embodiment, the electronic device 100 is in the first state (i.e., the closed state), the first body 110 and the second body 120 of the electronic device 100 are locked to each other. The user needs to remove the locking relation between the first body 110 and the second body 120 to rotate the first body 110 and the second body 120 with respect to each other. In order to provide a predetermined expanded angle between the first body 110 and the second body 120 after the locking relation between the first body 110 and the second body 120 is removed, an elastic member, such as a torsion spring 270, is disposed at the hinge structure 200. The torsion spring 270 is sleeved on a positioning part 226 on the second base 220, and the positioning part 226 may be a screw disposed to the second base 220. The torsion spring 270 has a first end 271 and a second end 272 opposite to each other, and the first end 271 and the second end 272 respectively abut against the first base 210 and the second base 220.

In the first state (i.e., the closed state) shown in FIG. 1, the torsion spring 270 is compressed, and is limited by the locking relation between the first body 110 and the second body 120 and therefore unable to release the stored elastic potential. After removing the locking relation between the first body 110 and the second body 120, the elastic potential stored in the torsion spring 270 is released, and the torque spring 270 may respectively abut against the first base 210 and the second base 220 through the first end 271 and the second end 272. In this way, the first base 210 (and the first body 110) and the second base 220 (and the second body 120) are rotated with respect to each other through coordinated operation among the first linking rods 230, the second linking rod 240, and the torque assembly 250.

In the embodiment, the second base 220 further includes a blocking part 227 located at a side of the positioning part 226. When the expanded angle between the first body 110 and the second body 120 is greater than a predetermined value, the first end 271 of the torque spring 270 is separated from the first base 210. The blocking part 227 is disposed on a movement path of the first end 271 to block the first end 271 and prevent the first end 271 from being moved excessively, as shown in FIG. 4. In addition, after the expanded angle between the first body 110 and the second body 120 is greater than the predetermined value, the torsion spring 270 is moved with the second body 120. Comparatively, in a process of converting the electronic device 100 from the second state (i.e., the expanded state) shown in FIG. 4 to the first state (i.e., the closed state) shown in FIG. 1, a portion of the first base 210 is moved through the first end 271 to abut against the first end 271 again. In this way, the torsion spring 270 is restored to the compressed state.

In view of the foregoing, in the hinge structure adopted in the electronic device of the invention, the first linking rods have a degree of freedom of motion of rotating with respect to the first base and a degree of freedom of motion of sliding with respect to the second base, and the second linking rod has a degree of freedom of motion of rotating with respect to the second base and a degree of freedom of motion of sliding with respect to the first base. In addition, the first linking rods and the second linking rod are pivoted to each other to be rotated with respect to each other. Besides, through coordinated operation between the torque assembly in the hinge structure and the shaft part of the second linking rod, the torque assembly may exert torque on the shaft part of the second linking rod in the process of rotating the first body and the second body with respect to each other. Since the shaft part is not connected with the first base or the second base, the torque assembly is more flexible design-wise, and helps reduce the thickness of the hinge structure. Therefore, the design requirement of being thinner and lighter can be better met.

It will be apparent to those skilled in the art that various modifications and variations can be made to the structure of the present invention without departing from the scope or spirit of the invention. In view of the foregoing, it is intended that the invention covers modifications and variations of this invention provided they fall within the scope of the following claims and their equivalents.

What is claimed is:
1. A hinge structure, comprising:
a first base;
a second base, disposed opposite to the first base;
at least one first linking rod, having a first pivot part, a first sliding part opposite to the first pivot part, and a second pivot part located between the first pivot part and the first sliding part, wherein the first pivot part is pivoted to the first base, and the first sliding part is slidably connected to the second base;
a second linking rod, disposed at a side of the first linking rod and having a second sliding part, a shaft part opposite to the second sliding part, a third pivot part located between the second sliding part and the shaft part, and a fourth pivot part located between the second sliding part and the third pivot part, wherein the second sliding part is slidably connected to the first base, the third pivot part is pivoted to the second base, and the second pivot part is pivoted to the fourth pivot part; and
a torque assembly, having a sleeve part and a connection part opposite to each other, wherein the sleeve part is sleeved on the shaft part and configured to generate torque during rotation with respect to the shaft part, and the connection part is connected to the second base.

2. The hinge structure as claimed in claim 1, wherein the torque assembly comprises a sliding rod and a guiding rod, the sliding rod comprises the sleeve part and a sliding part, and the guiding rod comprises the connection part and a guiding part, wherein the sliding part is slidably inserted into the guiding part, and the connection part is rotatably connected to the second base.

3. The hinge structure as claimed in claim 1, wherein an inner circumferential surface of the sleeve part contacts an outer circumferential surface of the shaft part, the outer circumferential surface of the shaft part has a first section and a second section connected with each other, and an outer diameter of the first section is smaller than an outer diameter of the second section.

4. The hinge structure as claimed in claim 1, wherein a recess is provided on an inner circumferential surface of the sleeve part, and the hinge structure further comprises a torque reinforcing member disposed in the recess and abutting against an outer circumferential surface of the shaft part.

5. The hinge structure as claimed in claim 1, wherein the first base has a first accommodating groove and at least one second accommodating groove arranged side by side, and the second base has a third accommodating groove and at least one fourth accommodating groove arranged side by side, the first accommodating groove is aligned to the third accommodating groove and configured to accommodate the second linking rod and the torque assembly, and the second accommodating groove is aligned to the fourth accommodating groove and configured to accommodate the first linking rod.

6. The hinge structure as claimed in claim 1, further comprising:
an elastic member, having a first end and a second end opposite to each other, wherein the first end and the second end respectively abut against the first base and the second base.

7. The hinge structure as claimed in claim 6, wherein the elastic member is a torsion spring, and the second base has a positioning part, wherein the torsion spring is sleeved on the positioning part.

8. The hinge structure as claimed in claim 7, wherein the second base further has a blocking part located at a side of the positioning part, and the blocking part is configured to block the first end of the elastic member when the first end is separated from the first base.

9. An electronic device, comprising:
a first body;
a second body; and
a hinge structure, wherein the first body is rotatably connected to the second body through the hinge structure, and the hinge structure comprises:
a first base, fixed to the first body;
a second base, disposed opposite to the first base, and fixed to the second body;
at least one first linking rod, having a first pivot part, a first sliding part opposite to the first pivot part, and a second pivot part located between the first pivot part and the first sliding part, wherein the first pivot part is pivoted to the first base, and the first sliding part is slidably connected to the second base;
a second linking rod, disposed at a side of the first linking rod and having a second sliding part, a shaft part opposite to the second sliding part, a third pivot part located between the second sliding part and the shaft part, and a fourth pivot part located between the second sliding part and the third pivot part, wherein the second sliding part is slidably connected to the first base, the third pivot part is pivoted to the second base, and the second pivot part is pivoted to the fourth pivot part; and
a torque assembly, having a sleeve part and a connection part opposite to each other, wherein the sleeve part is sleeved on the shaft part and configured to generate torque during rotation with respect to the shaft part, and the connection part is connected to the second base.

10. The electronic device as claimed in claim 9, wherein the torque assembly comprises a sliding rod and a guiding rod, the sliding rod comprises the sleeve part and a sliding part, and the guiding rod comprises the connection part and a guiding part, wherein the sliding part is slidably inserted into the guiding part, and the connection part is rotatably connected to the second base.

11. The electronic device as claimed in claim 9, wherein an inner circumferential surface of the sleeve part contacts an outer circumferential surface of the shaft part, the outer circumferential surface of the shaft part has a first section and a second section connected with each other, and an outer diameter of the first section is smaller than an outer diameter of the second section.

12. The electronic device as claimed in claim 9, wherein a recess is provided on an inner circumferential surface of the sleeve part, and the hinge structure further comprises a torque reinforcing member disposed in the recess and abutting against an outer circumferential surface of the shaft part.

13. The electronic device as claimed in claim 9, wherein the first base has a first accommodating groove and at least one second accommodating groove arranged side by side, and the second base has a third accommodating groove and at least one fourth accommodating groove arranged side by side, the first accommodating groove is aligned to the third accommodating groove and configured to accommodate the second linking rod and the torque assembly, and the second accommodating groove is aligned to the fourth accommodating groove and configured to accommodate the first linking rod.

14. The electronic device as claimed in claim 9, wherein the hinge structure further comprises:
an elastic member, having a first end and a second end opposite to each other, wherein the first end and the second end respectively abut against the first base and the second base.

15. The electronic device as claimed in claim 14, wherein the elastic member is a torsion spring, and the second base has a positioning part, wherein the torsion spring is sleeved on the positioning part.

16. The electronic device as claimed in claim 15, wherein the second base further has a blocking part located at a side of the positioning part, and the blocking part is configured to block the first end of the elastic member when the first end is separated from the first base.

\* \* \* \* \*